United States Patent [19]

McConnell

[11] Patent Number: 4,628,464
[45] Date of Patent: Dec. 9, 1986

[54] ROBOTIC SYSTEM FOR MOUNTING ELECTRICAL COMPONENTS

[75] Inventor: William P. McConnell, Columbia, Md.

[73] Assignee: Westinghouse Electric Corp., Pittsburgh, Pa.

[21] Appl. No.: 834,494

[22] Filed: Feb. 25, 1986

Related U.S. Application Data

[63] Continuation of Ser. No. 540,066, Oct. 7, 1983, abandoned.

[51] Int. Cl.[4] ........................... G06F 15/00; B25J 9/00
[52] U.S. Cl. ..................................... 364/513; 364/491; 29/721; 29/729; 29/759; 358/101; 382/8
[58] Field of Search ........................ 364/513, 488–491, 364/516, 525; 29/703, 709, 712, 720, 721, 729, 739, 740, 759; 358/101; 382/8; 901/40, 47; 356/138, 375, 399, 426

[56] References Cited

U.S. PATENT DOCUMENTS

| | | | |
|---|---|---|---|
| 3,986,007 | 10/1976 | Ruoff, Jr. | 364/513 |
| 4,017,721 | 4/1977 | Michaud | 364/513 |
| 4,146,924 | 3/1979 | Birk et al. | 364/513 |

Primary Examiner—Jerry Smith
Assistant Examiner—Allen MacDonald
Attorney, Agent, or Firm—E. C. Arenz

[57] ABSTRACT

A robot including a vision system for providing information to the robot to permit the robot to accurately place electrical components such as integrated circuits on a circuit board is disclosed. The vision system includes a first camera for generating signals indicating to the robot the precise location on the circuit board at which the components are to be placed. A second vision system provides to the robot information permitting the location and angular rotation of the component as held by the robot to be determined. The circuit board and component are then positioned in precise alignment by the robot and the robot places the circuit in the desired predetermined location.

7 Claims, 5 Drawing Figures

ROBOTIC SYSTEM FOR MOUNTING ELECTRICAL COMPONENTS

This application is a continuation of application Ser. No. 540,066 filed Oct. 7, 1983 now abandoned.

BACKGROUND OF THE INVENTION

The invention relates to robots and more specifically to robot systems which include a vision system permitting the robot to accurately position electrical parts in a predetermined location.

SUMMARY OF THE INVENTION

The invention comprises a robotic component positioning system which includes a visual system permitting the circuit board on which electronic components are to be mounted to be viewed from the top to determine the precise desired location of components relative to registration marks on the circuit board. Components to be mounted on the circuit board are then picked up by the programmable arm of the robot and positioned relative to a second vision system such that a high contrast outline of the component can be generated. The angular orientation of the component relative to the circuit board is determined and the component rotated to the proper angular position. The component is then repositioned in the X-Y direction to the proper location and the programmable arm of the robot moves to place the component on the circuit board. A digital computer is included to process data and generate control signals.

DETAILED DESCRIPTION

Figure 1:
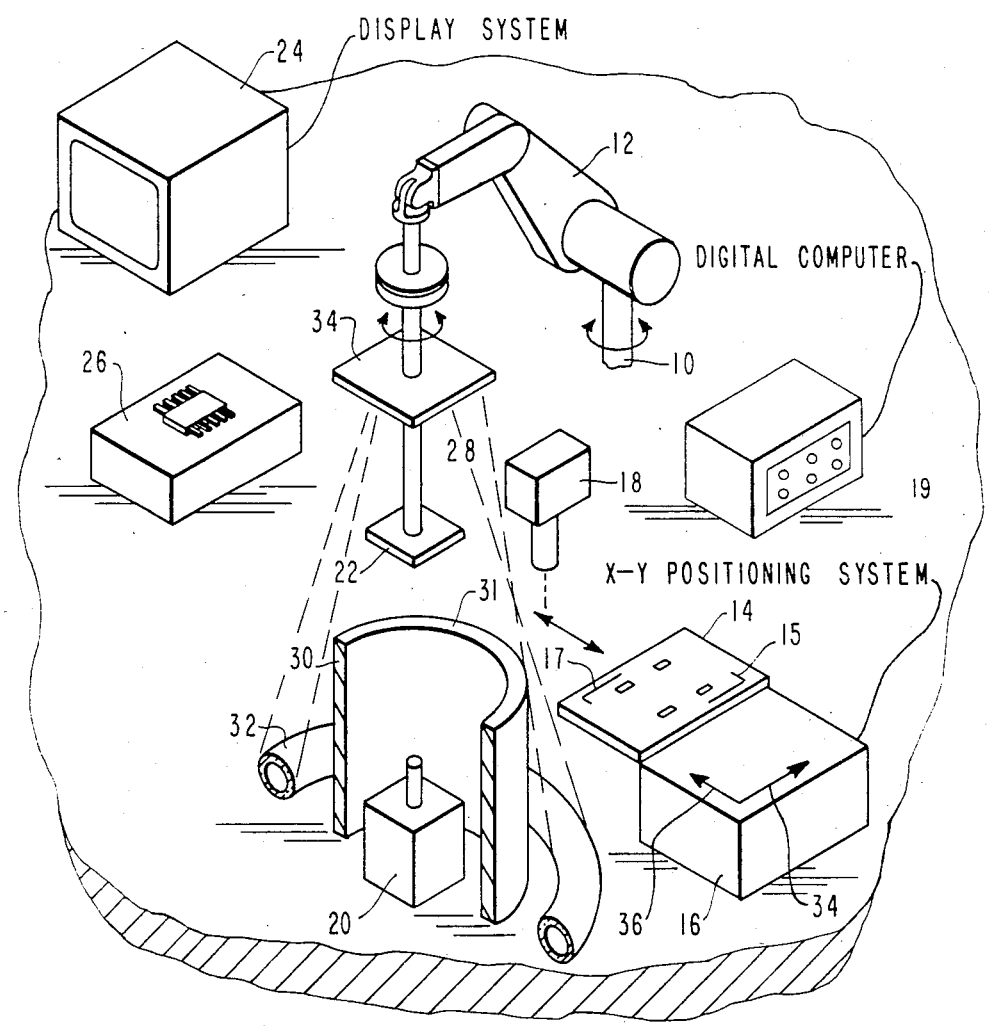
FIG. 1 is a somewhat functional drawing illustrating the invention.

FIG. 1 is a somewhat schematic drawing illustrating the preferred embodiment of the invention. More specifically, FIG. 1 illustrates all of the major components of the preferred embodiment, however, the electrical cabling interconnecting these components is not illustrated for purposes of simplifying the illustration.

Similarly, programs for the digital computer 17 are not included because the details of such programs are highly dependent of the specific computer used. In all instances writing suitable computer programs is believed to be routine tasks for those skilled in the programming art.

More specifically, the invention utilizes a conventional robot mechanism including a support 10 and a programmable arm structure 12. A circuit board 14 on which components are to be mounted is affixed to a conventional X-Y positioning mechanism 16. Circuit board 14 is also of conventional design and includes interconnect paths and mounting pads to which the leads of integrated circuits will be affixed, using conventional techniques.

A first vision device, such as a TV camera 18, provides means for viewing the top surface of the circuit board 14 to determine its orientation relative to the remainder of the robot. A second camera 20 provides a high contrast image of the integrated circuit 22 to be mounted on the circuit board 14. Conventional TV-type monitor 24 provides display means permitting data generated by the robot control system, such as the digital computer 17 which controls the robot, to be conveniently displayed to assist the operator in assuring that the system is functioning normally or to provide other useful information. The specific information displayed may vary with the application. However, specific examples of useful displays are subsequently discussed.

Integrated circuits to be placed on the circuit board 14 are first placed, using suitable techniques including conventional techniques, in a specific location such as storage bin 26 where they are accessible to the robot. Additionally, standard input devices (not illustrated) are included to provide suitable means for communicating with the computer 17 for the purposes of storing data and programming functions. (Such devices are conventional in the art and are not illustrated for purposes of simplicity.) System status information, especially status data related to the digital computer 17 may by available from the computer control panel 19. Other indicator panels which may include both status and control functions may be incorporated, depending on th specific details of the particular system. All of the components of the system are affixed to common support platform 13 to secure the components of the system in stable and fixed positional relationship with respect to each other. Conventional mounting techniques may be used to secure the various components comprising the system to the platform 13.

In positioning (placing or affixing) integrated circuits on the circuit board 14, it is first necessary for the robot control system (in the preferred embodiment, the digital computer 17 which controls the robot) to acquire accurate data specifying the desired location or locations of the various integrated circuits to be placed on the circuit board 14. In the preferred embodiment this is accomplished by storing in the digital computer 17 data representing the location of each integrated circuit on the circuit board 14 in relationship to position markers, such as position markers illustrated at reference numerals 15 and 17. This data storage function may be accomplished using conventional techniques, as previously described.

Additionally, data is stored in the computer 17 which identifies the location of the X-Y positioning system 16, TV camera 18 and TV camera 20 with respect to each other and in relationship to the programmable arm 12. In placing an integrated circuit on the circuit board 14, the robot (in the experimental system the digital computer 17 which controls the robot) moves the X-Y positioner 16 to position the circuit board 14 within the view of TV camera 18 and to position the circuit board 14 at the desired location or locations for positioning unitary rated circuits on the circuit board 14. This function is accomplished in a conventional manner utilizing computer generated move instructions to move (operate) the X-Y positioning system 16. Utilizing the image from this TV camera 18, the digital computer 17 determines the location of position indicators 15 and 17 with respect to the x and y axis, 34 and 36 of the robot system. This information provides sufficient data for the placing of the integrated circuit on the board 14 at the desired location, as described below. It should also be noted that the above operational sequence limits the possible position of the circuit board 14 to a plane which is substantially perpendicular to the vertical axis of the robot system. However, other orientations could be used.

More specifically, the mechanical arm (positioning mechanism) of the robot 12 is first programmed to pick up a component, an integrated circuit 22 for example, from the storage bin 26 using a vacuum probe 28. The programmable arm returns to the position indicated in FIG. 1. In this position the integrated circuit 22 is positioned near the vertical axis of a cylinder 30 inside which the television camera 20 is mounted. Around the outer edge of the cylinder 30 and spaced from the top thereof is a circular light fixture 32 which may be a circular fluorescent lamp, for example. The circular lamp 30 projects light upward to impinge on a plate 34 which has an unglazed under surface having a light color such as white. This diffuses the light impinging on the surface of plate member 34 and reflects it downward on the upper surface of the integrated circuit 22. Additionally, the integrated circuit 22 is positioned downward such that the upper edge of the cylinder 30 shields the bottom surface of the integrated circuit 22 from the direct light of the fluorescent lamp 32. This in effect permits the integrated circuit 22 to be backlighted using diffused light to generate a high contrast image of the integrated circuit 22 using TV camera 20. Backlighting is the preferred lighting technique for generating high contrast TV images.

Figure 2:
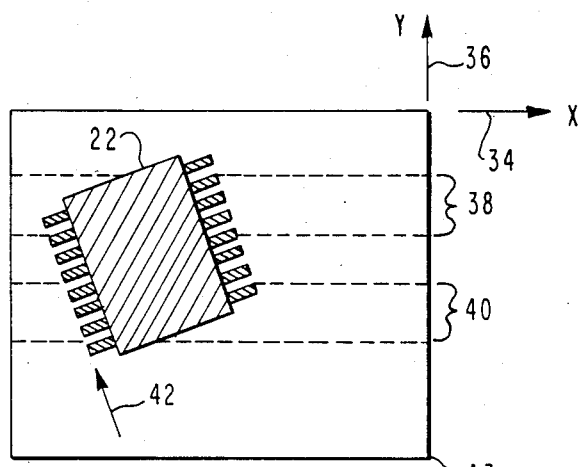
FIG. 2 is a drawing illustrating how the angular position of the component to be positioned by the robot is determined.

An image (TV) of the device 22 as it is initially picked up from the storage location 26 and positioned above TV camera 20 is processed by a digital computer 17 to generate a binary image of the integrated circuit 22 as illustrated in FIG. 2. The binary image is located within a rectangular area 43 which has edges substantially parallel to the X-Y axis, 34 and 36, of the robot. (Binary image meaning that each element of the image is black or white with no scales of gray). This type of image is conventional and is particularly useful in determining the edge of the integrated circuit 22 because the edges are always defined as an abrupt change from white to black. The orientation of the integrated circuit 22 is calculated with respect to the orientation (axis 34 and 36) of the robot with the calculated orientation of illustrated by reference arrow 42.

More specifically, to determine the orientation of the integrated circuit 22 with respect to the axis 34 and 36, two relatively wide bands 38 and 40 are selected. Within each of these bands the leftmost point of the TV image is determined. A straight line through these points is then calculated resulting in an orientation vector as indicated by the directional arrow 42. Utilizing directional arrow 42 and the axes 34 and 36 of the circuit board, the robot rotates the integrated circuit 22 to the orientation which places the edges of the integrated circuit 22 substantially parallel to axis 34 and 36.

Figure 3:
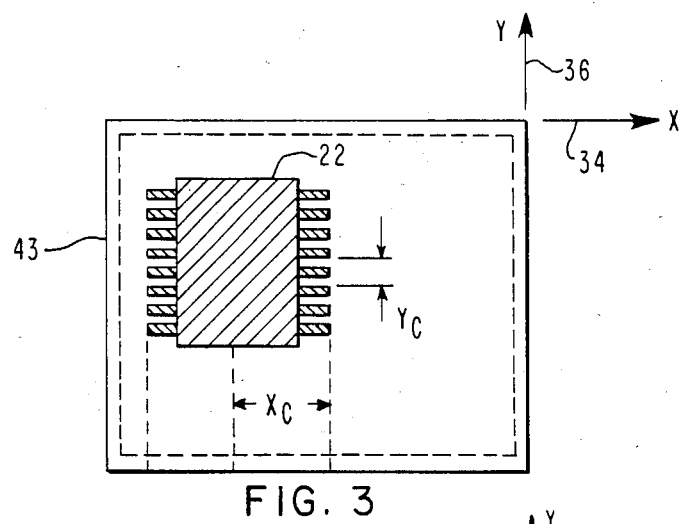
FIG. 3 is a drawing illustrating how the X-Y displacement of the component is determined.
Figure 4:
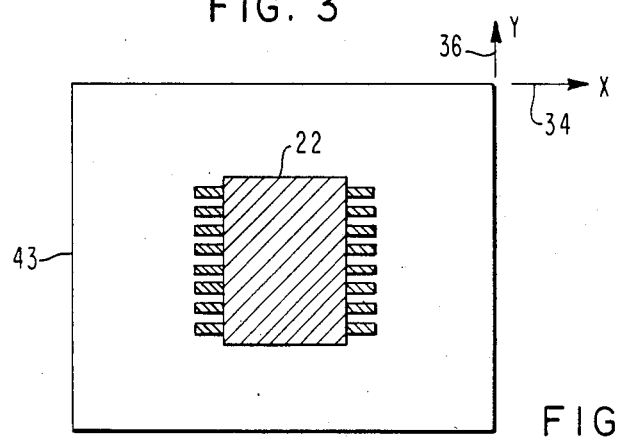
FIG. 4 is a drawing illustrating the component as repositioned to the desired location.

FIG. 3 illustrates the orientation of the integrated circuit 22 after the rotation described above has been accomplished. Following this rotation, the integrated circuit 22 is centered within the area 43. Centering is accomplished by calculating two distances ($X_c$ and $Y_c$), each specifying the distance the integrated circuit 22 must be moved in the X and Y directions utilizing the robot's arm to position the integrated circuit 22 at the center of area 43, as indicated in FIG. 4. The digital computer 19 issues move commands causing the X-Y positioning system 16 to move the circuit board 14 such that the center of the mounting pads for the integrated circuit corresponds to the center area 43. This places the integrated circuit 22 and circuit board 14 in the proper position in the X and Y directions for affixing the integrated circuit 22 to the circuit board 14. However it should be noted at this point that the integrated circuit 22 is positioned above the top surface of the circuit board 14 and held in this position by robot arm 12.

Alternatively, the angular effect may be calculated using other techniques. For example, the angular orientation of the leads of the integrated circuit 22 may be calculated by assuming a line through each pair of opposite leads. The angle of each line with reference to the X and Y axis, 34 and 36 is calculated. The average of these angular calculations is assumed to be the rotational error. After the rotational error is corrected, the average of the positions of all of the lead tips can be used to reposition the integrated circuit 22 in both the X and Y directions. Other angular and rotational error corrections calculation techniques may also be used.

Figure 5:
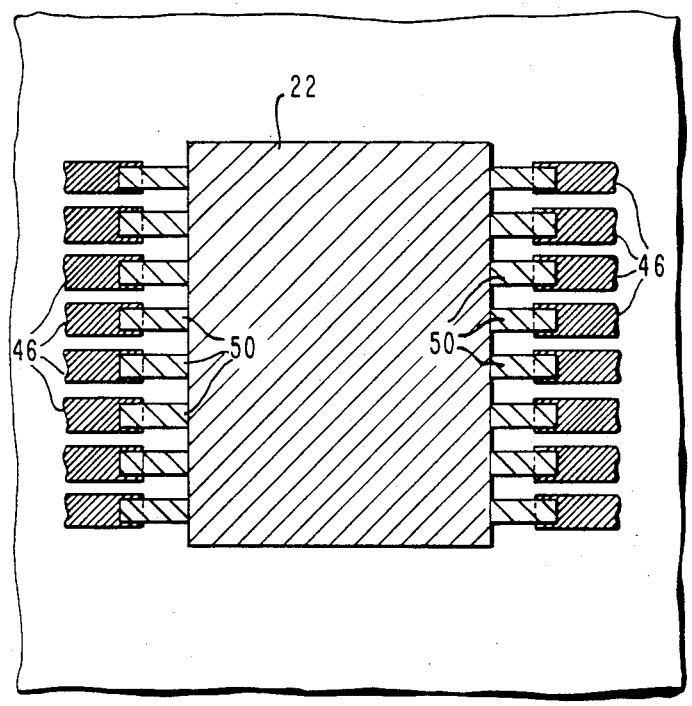
FIG. 5 is a composite drawing overlaying the image of the component with portions of the circuit board to determine that the component can be placed on the board in the proper location.

Following repositioning of the integrated circuit 22 as indicated in FIG. 4 and the X-Y positioning system 16, the computer 17 has all the information specifying the desired location of the integrated circuit 22 on the circuit board 14 as well as the location and size of the mounting pads 46 (FIG. 5) on the circuit board 22. Utilizing this information, the computer 17 produces a composite image (FIG. 5) of the mounting pads 46 and the overlap of the leads 50 of the integrated circuit 22 with the mounting pads 46. If the calculated position of the leads 50 is proper with respect to the mounting pad 46, the robot positions the circuit 22 such that the leads contact the mounting pads 46. That is, the programmable arm 12 moves to lower the integrated circuit 22 to the upper surface of the circuit board 14 where it is held in position by an adhesive, as subsequently described. If the integrated circuit 22 is not positioned properly as indicated by the composite image, it is rejected based on the assumption that the integrated circuit 22 contains some mechanical problem. The composite image is displayed on the TV monitor 24, as a visual aid to the operator.

The operation of the system has been described above with respect to an operation in which the integrated circuit 22 (component) is positioned on the circuit board 14 such that the edges of the integrated circuit are substantially parallel to the axis 34 and 36 of the robot. Obviously, the control commands to the robot could be easily charged to properly positioned components with different orientations.

Prior to positioning the integrated circuit on the mounting pads, as described above, selected areas of the circuit board 14 are coated with an adhesive using suitable prior art techniques. After positioning on the circuit board 14, the integrated circuit 22 will be temporarily held in the desired position, permitting the leads 50 of the integrated circuit 22 to be affixed to the mounting pads 46 using suitable bonding techniques as a part of the subsequent manufacturing cycle.

In addition to the mounting procedure described above, the storage location 26 may include apparatus to functionally test the integrated circuits before they are picked up by the robot. These tests can locate faulty as well as wrong components before they are mounted on the circuit board 14. Additionally, if all of the integrated circuits to be mounted on the circuit board 14 are not of the same type, the various circuits must be supplied to the robot in the proper order.

Although the invention has been disclosed with reference to a system for placing integrated circuits on a circuit board, it is obvious that other components could be similarly positioned.

I claim:

1. A system for positioning an electrical component at a predetermined location on a circuit board, comprising:
   (a) light producing means for projecting light in an array which is peripherally beyond the periphery of said component to avoid illuminating a bottom side of said component and to illuminate reflecting means spaced above the top side of said electrical component;
   (b) visual means positioned to view the bottom side of said component and to produce a high contrast image of the peripheral shadow of said component;
   (c) said visual means including means utilizing said high contrast shadow image for generating the angular rotational and position data of said electrical component;
   (d) first positioning means utilizing said angular rotational data for rotating said electrical component to a predetermined angular position relative to said circuit board;
   (e) second positioning means utilizing said position data for repositioning said electrical component relative to said circuit board in at least first and second directions; and
   (f) third positioning means for positioning said electrical component in at least a third direction to position said electrical component at said predetermined location on said circuit board.

2. A system for positioning an electrical component at a predetermined location on a circuit board, comprising in combination:
   (a) a light source located on one side of one face of said component for projecting a light array having a predetermined profile past the outside periphery of said component to avoid illuminating said one face;
   (b) a reflecting surface disposed in spaced relation from the other face of said component and within said light array for reflecting light toward said other face to produce a high contrast peripheral shadow beyond said one face;
   (c) light sensitive image means positioned in spaced relation from said one face of said component and responsive to the position of said shadow for generating angular and positional data; and
   (d) positioning means responsive to said data and to further data specifying the desired location for said electrical component on said circuit board to position said electrical component on said circuit board to said predetermined location.

3. A system in accordance with claim 2 wherein said light source for projecting said predetermined profile is a circular source.

4. A system in accordance with claim 3 wherein said light source has a high intensity circular edge portion and a lower intensity central portion and includes (1) a cylinder having a selected diameter and first and second ends, and (2) said circular light source is positioned around said cylinder at a selected distance from said first end such that said end forms a shadow producing said lower intensity central portion, and said light source comprises a circular fluorescent lamp.

5. A system in accordance with claim 4 wherein said light sensitive image means comprises (1) a TV camera positioned to view said electrical component through an end opening of a cylinder positioned around said TV camera.

6. A system in accordance with claim 5 further including means for comparing the dimensions of the leads of said electrical component to the dimensions of the mounting pads for said leads prior to positioning said component on said circuit board.

7. A robotic system for positioning integrated circuits of a circuit board at a desired location comprising:
   (a) means for determining the location at which an integrated circuit is to be positioned relative to the robot from data specifying the location at which integrated circuits are to be positioned relative to position markers on said circuit board and a tv image of said position markers on said circuit board;
   (b) lighting means for back lighting said integrated circuit using a light source mounted in front of said integrated circuit;
   (c) image means for producing a high contrast image of said integrated circuit;
   (d) means for utilizing data specifying the location at which said integrated circuit is to be positioned on said circuit board and said high contrast image of said integrated circuit to control said robotic system to position said integrated circuit on said circuit board at said desired location.

* * * * *